Figure 1:
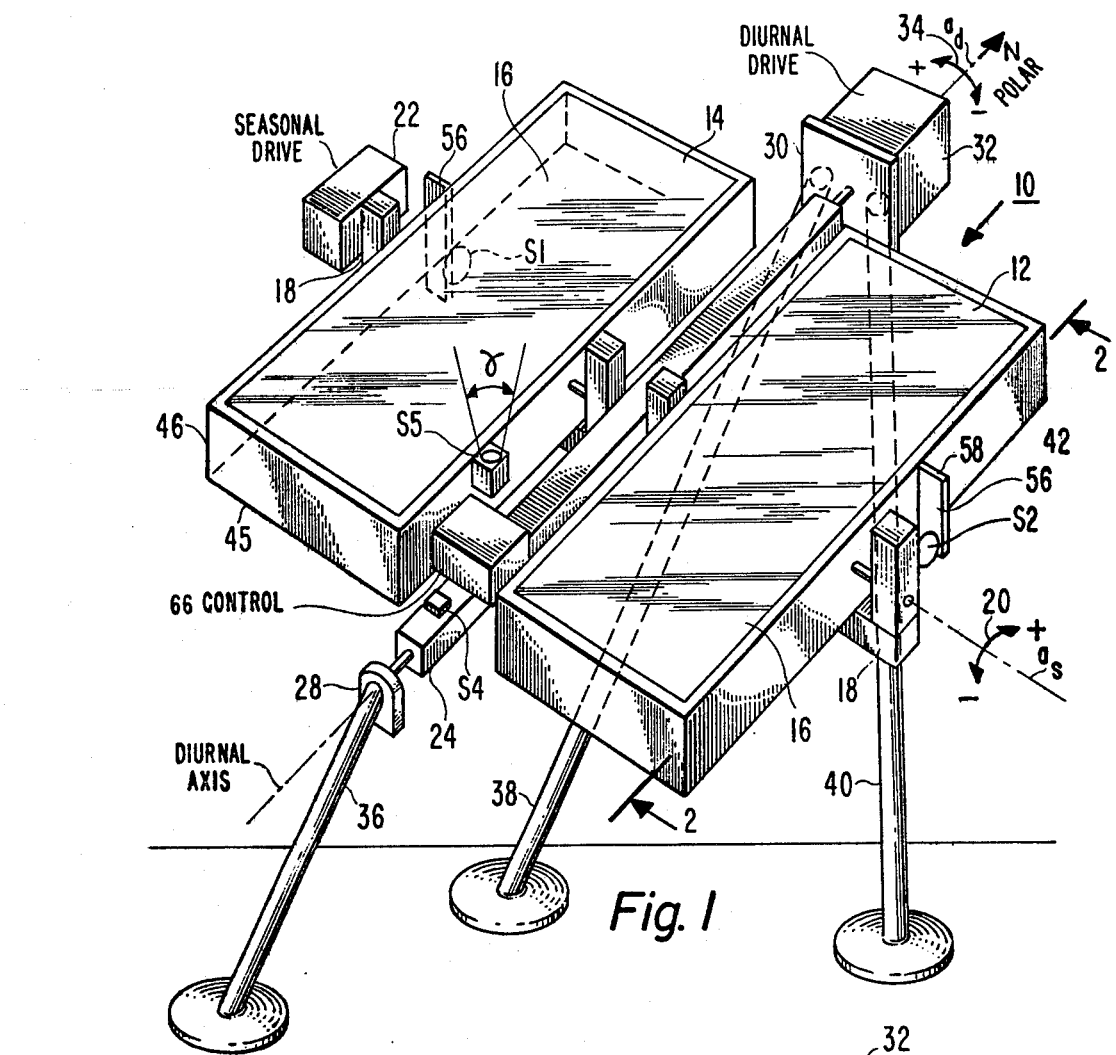

United States Patent [19]
Miller

[11] 4,367,403
[45] Jan. 4, 1983

[54] ARRAY POSITIONING SYSTEM WITH OUT-OF-FOCUS SOLAR CELLS

[75] Inventor: Arthur Miller, Princeton Junction, N.J.

[73] Assignee: RCA Corporation, New York, N.Y.

[21] Appl. No.: 292,017

[22] Filed: Aug. 11, 1981

Related U.S. Application Data

[62] Division of Ser. No. 113,506, Jan. 21, 1980, Pat. No. 4,314,546.

[51] Int. Cl.³ ............................................. G01J 1/20
[52] U.S. Cl. ............................ 250/203 R; 356/141; 126/425
[58] Field of Search ................... 250/203 R, 202; 126/425, 424; 356/141, 152

[56] References Cited
U.S. PATENT DOCUMENTS 3,954,340 5/1976 Blomquist et al. ......... 250/203 R X
4,287,411 9/1981 Beucci ........................... 250/203 R

*Primary Examiner*—David C. Nelms
*Assistant Examiner*—Darwin R. Hostetter
*Attorney, Agent, or Firm*—Samuel Cohen; William Squire

[57] ABSTRACT

A solar array positioning system includes first light sensor means facing the same direction as the solar array and second light sensor means facing the opposite direction. A third sensor, this one responsive to gravity, is employed to indicate the direction about a diurnal slew axis that the array is tilted. These sensors are employed to determine the initial array slewing direction to insure that during slewing and subsequent tracking, the array never is rotated through more than a given angle, less than 360°, between two fixed limits. This permits connection to the array by hard wiring rather than slip rings. The system includes also fourth sensor means for providing fine tracking signals which assume control of the array position during tracking. A vane structure reduces the sensitivity of various of the sensors to obscuration by foreign particles. A low cost uncorrected lens may be used with the fourth.

3 Claims, 14 Drawing Figures

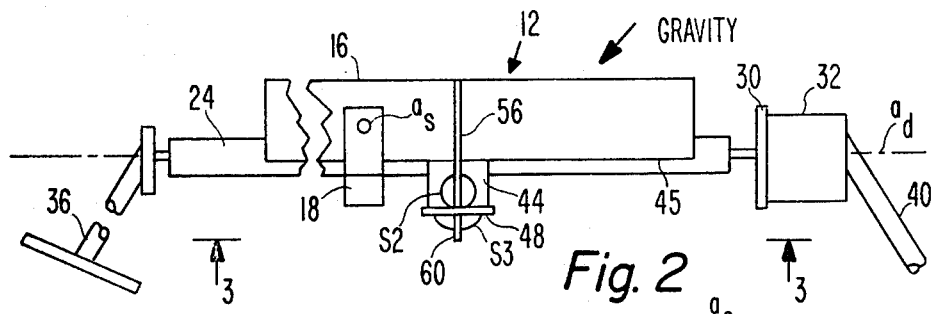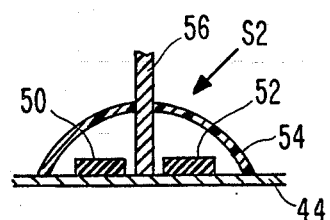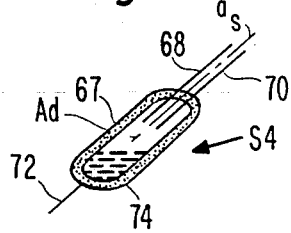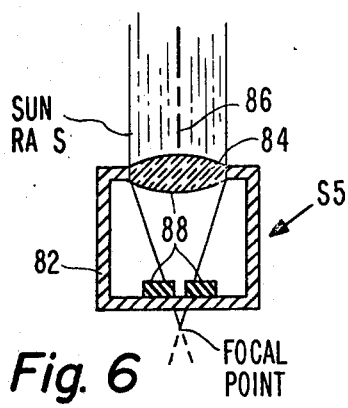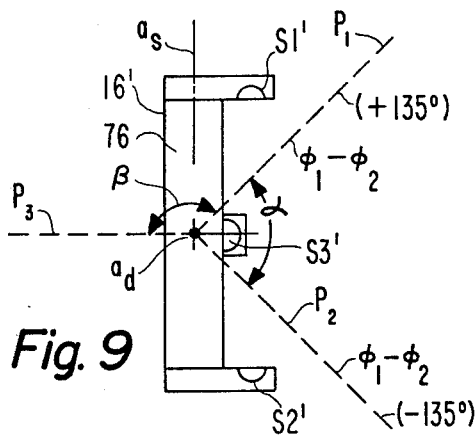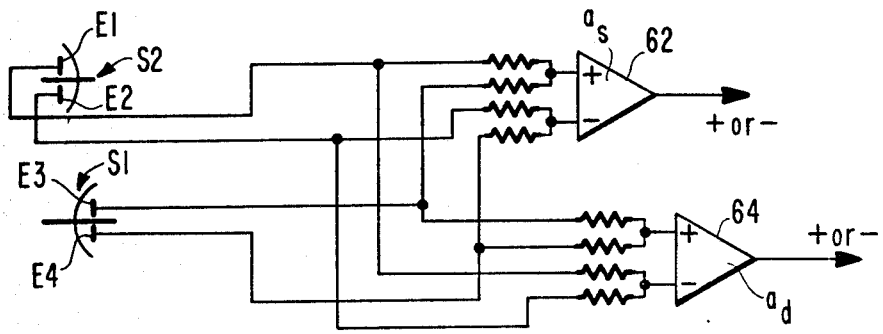

ARRAY POSITIONING SYSTEM WITH OUT-OF-FOCUS SOLAR CELLS

This is a division, of application Ser. No. 113,506, filed Jan. 21, 1980, now U.S. Pat. No. 4,314,546.

The present invention relates to solar tracking systems, and more particularly, to solar sensor systems that generate electrical signals for operation of servo-motors for controlling the attitude of the tracking system.

Solar energy conversion systems translate solar radiant energy into a useable form such as thermal energy or electricity. The transducing means (i.e. photovoltaic cells in the case of an electrical system) may be relatively expensive and a significant part of the system cost. One way to reduce the cost of the system in the sense of obtaining greater efficiency in the utilization of the solar energy, is to concentrate the sun's radiation onto the transducing means. Again using photovoltaic cells as an example, their active area in a system employing solar concentrators, such as an array of lens, mirrors or the like, each focusing the same rays onto a different photovoltaic cell, may be less than 1% of that required for a system without a concentrator.

In most conversion systems which employ concentrators, a tracking system is employed to control the attitude of the concentrators as a function of the diurnal rotation and seasonal changes in orientation of the earth relative to the sun, to maximize the radiation incident on the transducer means. In such a tracking system, an error of only one half degree of arc represents a mis-aiming or more than one solar diameter which in many systems is unacceptable. During evening hours or cloudy weather when solar energy is not available, the concentrators (i.e. an array of lenses) and their associated photovoltaic cells become misoriented with respect to the sun. When the sun again appears, the tracking system must be able to reorient the concentrator-photovoltaic cell array, hereafter simply termed the "CP array," over a wide angular range relative to the polar axis, sometimes termed the diurnal axis, as discussed in more detail below.

Practical power output levels from a conversion system employing solar concentrators can be obtained during the time the sun is at greater than some minimal elevation, such as 10 degrees, above the horizon. During the summer months at moderate latitudes, e.g., up to 58°, this can be for 7-1/6 hours before and 7-1/6 hours after local noon, a total of 14⅓ hours. Since each hour of operation requires a rotation of 15 degrees about the polar axis of the concentrator, it is desirable that the CP array be capable of motion about this axis of at least ±107½ degrees relative to its position at local noon. When the sun first appears, the CP array can be in any orientation within this range. It is possible, for example, that the concentrators of the CP array may be facing 180° away from the sun. In this case the tracking system initially will have to swing the CP array through an angle of at least 180° to its correct orientation. If the tracking system were to always rotate or slew the CP array in the same direction, then slip rings would be required to provide electrical connection from the photovoltaic cells to parts of the system which are not rotated. Slip rings are not considered to be sufficiently reliable for this application. Another problem encountered in systems of the type discussed above is that on sunny days, bright clouds near the sun may cause signals to be produced by the tracking system sensor(s) which cause mis-aiming of the CP array. Another is that if these sensor(s) should become partially obscured by insects, leaves, bird droppings, or other foreign matter, the tracking system may deliberately mis-orient the CP array in an attempt to overcome the resulting signal imbalance.

Aside from the problems discussed above, to be practical the tracking system should be inexpensive. This precludes certain designs that otherwise might be attractive. For example, a clock driven system could not be allowed to slip without resulting in mis-aiming. Such a non-slip system would require a system rigid enough to withstand the anticipated wind loading. Such rigidity implies a bulky and expensive drive mechanism which makes the system very costly.

Prior art tracking systems may use one of two different types of sensors. One is known as an "integrating" sensor, in which some conversion device, such as a photodiode or photoconductive element, is illuminated by light collected over a wide range of solid angles. This collection over a wide range of angles is made possible by diffusing the light before it is incident on the conversion device. In one example, a translucent hemisphere is placed over photodiodes situated on opposite sides of a tracking system. When the hemispheres are illuminated unevenly so that a larger portion of one hemisphere is illuminated as compared to the other, the current output of its photodiode has a correspondingly higher value than that of the solar photodiode in the other hemisphere. This unbalance in output currents operates a servo-motor that drives the system in a direction to correct the imbalance. When the two outputs are equal, the hemispheres are illuminated symmetrically and the system is aimed directly at the sun.

Tracking the seasonal variation of the sun's apparent position requires tipping the system about an axis normal to the polar axis. An additional pair of hemispherical sensors may be provided along the seasonal axis for controlling the tracking system's position about that axis.

Integrating sensors have the advantage that they are responsive to illumination over a very large range of solid angles. Their sensitivity, i.e., the degree of electrical unbalance that is generated by a given departure of the sun's illumination direction from a symmetrical configuration, can be enhanced by the use of shadow vanes, which are opaque. The use of shadow vanes and how they enhance sensitivity is illustrated with more particularity in U.S. Pat. No. 4,151,408. Such vanes, by increasing the sensitivity of the system, provide greater aiming accuracy.

A drawback of the systems described above is that equal outputs from the photodiodes can also result when the sun is directly behind the tracking system. That is, the system may also track in a stable mode 180° out of the desired orientation.

The second kind of sensor which is termed an "imaging" sensor includes lenses or concave reflectors to form an image of the sun on the surface of the detector. The detector may be split into four 90° quadrants as shown, by way of example, in U.S. Pat. No. 4,041,307. Imaging sensors have the advantage of high sensitivity to small angular mis-aiming. An image at the focus of a well corrected lens (or reflector) also has the property that should the lens be partially obscured, the position of the image does not change. Only the brightness of the image changes. Such a sensor, therefore, should be nearly completely immune from mis-aiming due to partial obscuration of the lens. An application for such a lens requires that the lens be reasonably large in diameter, greater than "1", and a low f number to minimize partial obscuration and to achieve an appropriate angular field of view. However, taking costs into consideration, such a lens or reflector, if well corrected, is relatively costly and is not desirable in an inexpensive tracking system.

A tracking system embodying the present invention comprises a plurality of sensor means for producing control signals indicative of the initial orientation of a CP array. These include light sensors which indicate the general direction to the sun and an attitude sensor for indicating the direction in which the CP array is tilted about the diurnal axis. Signals derived from these sensors are employed to slew the CP array toward its tracking position in a direction to insure that the array never rotates through more than a given angle (less than 360°) between fixed limits.

Additional features of a solar tracking system embodying the present invention include a light sensor (which may be employed for producing tracking signals) having an uncorrected lens at a given focal length and wherein solar sensor means are at a plane other than at the focal length to provide increased immunity from partial obscuration of the lens. A further feature of a system embodying the present invention includes solar sensor means and control means arranged to track the sun in a diurnal cycle. The sensor means including spaced voltaic generator means and light diffusing means over the generator means including vane means adjacent each generator means oriented to reduce the sensitivity of the generator means to the shadowing effect of partial obscuration of the light diffusing means by foreign matter.

Figure 8:
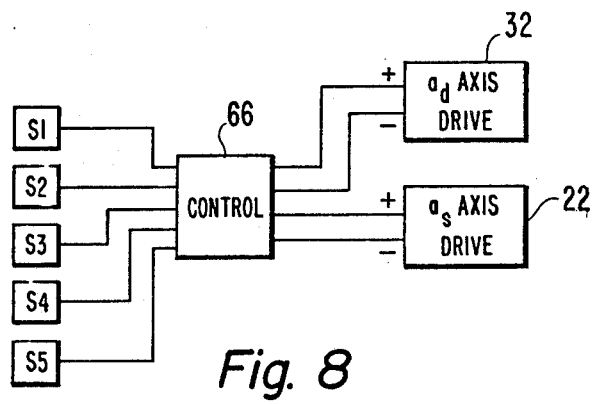
Figure 3:
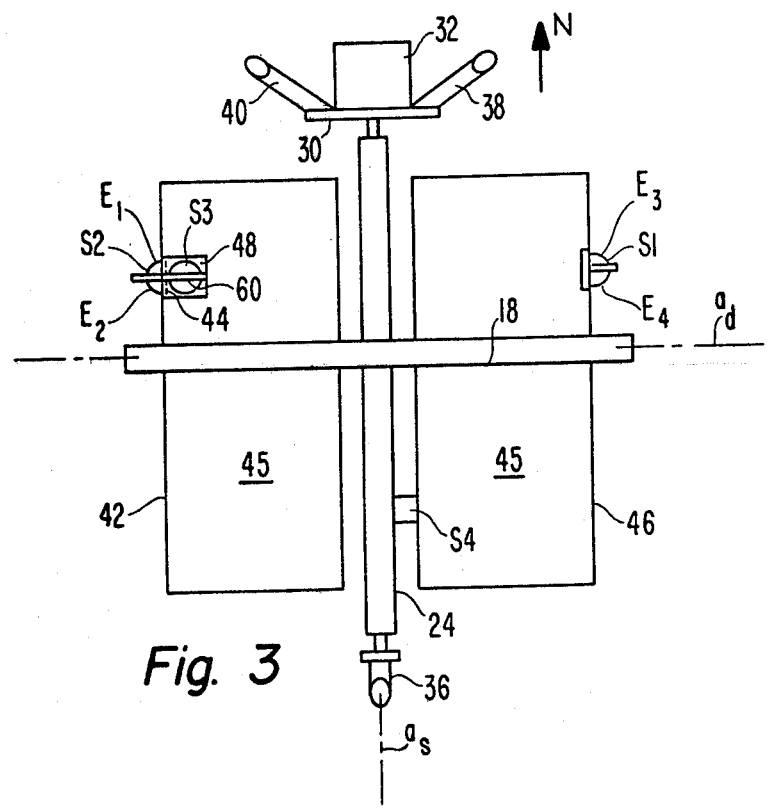
Figure 14:
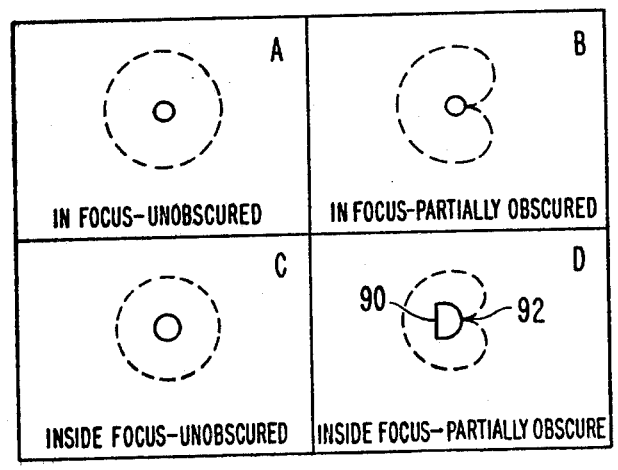

In the drawing:

FIG. 1 is an isometric view of a tracking system embodying the present invention, FIG. 2 is a side elevation view of the embodiment of FIG. 1 taken along lines 2—2, FIG. 3 is a bottom plan view of the embodiment of FIG. 1 taken along lines 3—3 in FIG. 2, FIG. 4 is a sectional view through a gravity attitude sensor switch, FIG. 5 is a sectional view through an integrating sensor employed in the embodiment of FIG. 1, FIG. 6 is a sectional elevational view through the imaging sensor of the embodiment of FIG. 1, FIG. 7 is a schematic diagram illustrating the summing arrangements for some of the photoelectric solar sensors employed in the embodiment of FIG. 1, FIG. 8 is a block diagram of the control system, FIG. 9 is a diagram useful in explaining the principles of the present invention, and FIGS. 10–14 are graphs useful in explaining the principles and operation of the tracking system of the present invention.

In FIG. 1 solar generator system 10 includes two identical sets of CP arrays 12 and 14. The front of the arrays at 16 is normally aimed at the sun. Such arrays are well known and need not be described in detail. Generally, each array includes a transparent front cover at 16 which may be glass, an array of concentrating lenses, and a corresponding array of photovoltaic cells for receiving concentrated solar energy from the respective lenses. In another form of array system, thermal generators may be substituted for the photovoltaic generators. In general, for purposes of the present invention, any kind of thermal conversion or electrical conversion system may be employed with the tracking system to be described.

The arrays 12 and 14 are pivotally mounted to yoke 18. The arrays 12 and 14 pivot about the seasonal axis $a_s$ in direction 20. The arrays 12 and 14 are rotated in directions 20 by the seasonal drive means 22 mounted to the yoke 18. The drive means 22 may be a servo motor and associated gearing arrangement or in the alternative, could be any other drive system, such as a belt and pulley arrangement. The rotation of the arrays 12 and 14 about the seasonal axis $a_s$ takes into consideration the variations of the orientation of the earth's polar axis with respect to the sun during the annual period. These variations are $\pm 23\frac{1}{2}°$ from the position that occurs at the equinox. During tracking, the axis $a_s$ is always maintained as close to normal to the sun's rays as possible. When the axis $a_s$ is normal to the sun's rays, it is horizontal at one particular time of day, local noon. The sun's orientation and the CP array's orientation at this time are reference orientations for the control system to be described later. The term "reference orientation" will be used to describe these orientations. In this orientation, the normal to the CP array will be considered to be at 0° and the line to the sun also to be at 0°. The control system, to be described later, orients the CP array with respect to this reference orientation.

The yoke 18 is secured to support 24. Support 24 may be an elongated post whose long axis is perpendicular to the axis $a_s$. Support 24 is positioned centrally between the two arrays 12 and 14 and rotates about the diurnal axis $a_d$ which is parallel to the earth's polar axis. The direction of this axis remains fixed with respect to the earth. Support 24 is rotatably mounted between two bearing supports 28 and 30 which are secured to earth by legs 36, 38 and 40 in a tripod arrangement. Diurnal drive means 32 is mounted to the bearing support 30. This drive means may include a servo motor and associated gear box for rotating the support 24 about the diurnal axis $a_d$ in the directions 34. Clockwise directions about axes $a_s$ and $a_d$ are indicated as positive while the counter clockwise directions are indicated as negative.

Solar radiation sensor S2 is secured to and coextensive with side 42 of the array 12 frame. Sensor S2 is mounted to a bracket 44, FIG. 2, whose outer surface is coplanar with the plane outer surface of side 42. Sensor S2 is located below the rear surface 45 of the array 12. Sensor S2 faces outwardly from the array in a direction parallel to axis $a_s$. Sensor S1 is identical to sensor S2, is mounted in identical fashion to side 46 of array 14 directly opposite sensor S2 and facing in the opposite direction parallel to axis $a_s$. Sensors S1 and S2 are coplanar with the respective sides 46 and 42 of the arrays 14 and 12 and situated below the rear surface 45 of the respective housings of the arrays so that the sides 42 and 46 serve also as shadow vanes for these sensors.

Sensor S3 is identical to sensors S1 and S2 and is secured to a bracket 48 which is connected to bracket 44 and extends therefrom. Bracket 48 forms a base surface on which the sensor S3 is mounted. Sensor S3 faces in a direction normal to the plane in which the axes $a_d$ and $a_s$ lie and in a direction opposite to the direction in which the solar cells of the arrays 12 and 14 are facing. Thus, when the solar cells on arrays 12 and 14 are aimed directly at the sun, the sensor S3 is underneath the arrays and in shadow.

A typical sensor S2 is shown in FIG. 5. The sensor S2 comprises two identical photodiodes 50 and 52 symmetrically mounted within a translucent thermoplastic hemisphere 54 mounted on bracket 44. The hemisphere 54 is slightly flattened at its peak to provide optimum diffusion of light to the photodiodes. The hemisphere 54 is split into two semi-hemispheres or quarter spheres by opaque vane 56. Vane 56 is a rectangular member which has an edge 58 coplanar with the face of the array 12 (FIG. 1) and an opposite edge mounted to the bracket 44. The vane 56 is a plane member whose plane is perpendicular to the direction of axis $a_d$. This construction is generally typical of the remaining sensors S1 and S3. The exception with respect to sensor S3 is that its vane 60 is mounted to the underside of bracket 48. Vane 60 extends in a direction perpendicular to the plane in which axes $a_d$ and $a_s$ lie and above the hemisphere 54 of sensor S3. The vanes 56 and 60 preferably lie in the same plane.

Thus, the photodiode 52, FIG. 5, of sensor S2 lies in one hemisphere quadrant while the photodiode 50 lies in a second hemisphere quadrant on opposite sides of the vane 56. The photodiodes 50 and 52 in each of the sensors S2, S1 and S3 form three sets of sensor pairs which will be hereinafter referred to as $E_1$, $E_2$; $E_3$, $E_4$; $E_5$, $E_6$, respectively, where sensors $E_1$, $E_3$ and $E_5$ lie on the northerly side of the arrays and the remaining sensors lie on the southerly side of the arrays, FIG. 1.

The sensors $E_1$–$E_4$ control the coarse slewing of the CP array. In the event that the optical array initially is facing in the general direction of the sun so that the sensors S1 and S2 receive more light than the sensors S3, then control signals derived from S1 and S2 drive the CP array to within a small angle such as 6° of the final tracking position as described directly below. In the event that the optical array initially is oriented so that its backside 45 (and the position sensor S3) is facing in the general direction of the sun (so that S3 receives more light than S1 or S2) then a control signal derived from the S3 signal will in a sense override the S1 and S2 signals. In more detail, the S3 signal is employed to produce the motor drive signal for drive means 32 and a control signal derived from the gravity sensor S4 is employed to control the sense in which such drive signal is applied to 32, to initially slew the CP array around axis $a_d$ to its coarse position within tracking range. This is discussed later.

The sensors $E_1$, $E_2$, $E_3$, and $E_4$ may be electrically wired as illustrated in FIG. 7. Sensors $E_1$ and $E_3$ serve as two inputs to the non-inverting terminal (+) of amplifier 62 to provide a positive output signal to drive the seasonal drive means 22 in a positive direction about the axis $a_s$. Sensors $E_2$ and $E_4$ are connected to the inverting (−) input terminal to amplifier 62 whose output is a negative signal for driving the drive means 22 in a negative direction about the axis $a_s$.

Thus, when the sensors $E_1$ and $E_3$ provide a greater output than the sensors $E_2$ and $E_4$, their signal causes the arrays to be rotated in a clockwise direction to decrease the solar energy incident on $E_1$ and $E_3$ and increase the solar energy incident on $E_2$ and $E_4$ due to the stationary effect of the vanes 56 and 60. This provides a seasonal adjustment about the axis $a_s$.

Sensors $E_1$ and $E_2$ serve also as inputs to the inverting terminal of amplifier 64. The sensors $E_3$ and $E_4$ are connected to the non-inverting terminal of amplifier 64. These sensors provide signals for rotating the arrays about the diurnal axis $a_d$. When sensors $E_3$ and $E_4$ together provide a greater output than sensors $E_1$ and $E_2$, this indicates that the arrays should be rotated in a positive clockwise direction about the polar axis $a_d$. The output of amplifier 64 is applied to the diurnal drive means 32 via control 66, FIG. 8, to rotate the arrays 12 and 14 in the positive clockwise direction. When the summed output of the sensors $E_1$ and $E_2$ is equal to the summed outputs of sensors $E_3$ and $E_4$ the arrays are aimed at the sun to within some angle such as 6° or so. The sides 42 and 46 of the arrays serve as shadow vanes in this mode.

The output of the sensors S1, S2 (and also of sensors S3, S4 and S5) are applied to control 66, FIG. 8, to be described which provides suitable output signals for operating the diurnal drive means 32 or the seasonal drive means 22 in the proper direction. With respect to sensors S1 and S2, approximately correct aiming about the diurnal axis is achieved when the sum of the currents from sensors $E_1$ and $E_2$ equals that from sensors $E_3$ and $E_4$. Correct aiming about the seasonal axis is achieved when the sum of the currents from sensors $E_1$ and $E_3$ equals that from the sensors $E_2$ and $E_4$. The functions of the remaining sensors S3, S4 and S5 will be discussed below.

The sensor S4 is secured to the support 24. Sensor S4 is a gravity sensor which provides a signal which indicates the attitude or orientation of the arrays about the diurnal axis. The sensor S4 may be a mercury switch as shown in FIG. 4. In FIG. 4, sensor S4 comprises a tubular housing 67 into which two electrodes 68 and 70 project at one end approximately equidistant from the long center line 72 of the housing. A small amount of mercury 74 inside the housing is free to flow within the housing and electrically connects the electrodes 68 and 70 when they point toward the earth and electrically open when they point toward the sky. When the housing 67 axis 72 is horizontal it is an "I don't care" condition, as will be explained. The switch conditions of sensor S4 are designated positive and negative. Sensor S4 is connected to the control 66 of FIG. 8. When the axis 72 of the switch of FIG. 4 is horizontal, the axis $a_s$ of the arrays of FIG. 1 is also horizontal. This indicates the reference orientation as mentioned above. When the switch is closed, it indicates the array is at one orientation with respect to its reference orientation and when open, it indicates the array is in a second orientation with respect to the reference orientation.

In FIG. 9, box 76 represents the arrays 12 and 14. 16' indicates the face of the arrays which is to be aimed toward the sun. The sensors S1', S3' and S2' represent the sensors S1, S3 and S2 of FIG. 1. Sensor S3' is centrally disposed on the bottom of the array 76 of FIG. 9 for purposes of illustration. It will be apparent that this sensor can be displaced in a direction parallel to the seasonal axis $a_s$. If we assume that the configuration of FIG. 9 is one in which we are looking down at the array from the sky toward the earth, it is seen that the sky is divided into three cylindrical segments formed by planes into the drawing along dashed lines $P_1$, $P_2$ and $P_3$. The sector formed by the planes of dashed lines $P_1$ and $P_3$ encloses space in which the sun causes sensor S1' to have the greatest output current of the three sensors S1', S2' S3'. Hereinafter, when the sensors are referred to as having a given output, it is implied that the diode pairs of that sensor are electrically tied together. The planes of dashed lines $P_1$ and $P_2$ define the sector in space in which the sun causes the output of sensor S3' to be a maximum. The planes of lines $P_2$ and $P_3$ defines the sector in space in which the sun causes the output of sensor S2' to be a maximum.

The planes of the dashed lines define a locus of points of the sun's positions in which the outputs of two adjacent sensors are equal. For example, sensor S1' has an output that is equal to that of sensor S3' when the sun is aimed at the array along the plane of dashed line $P_1$. The orientation of the sensor S1' is a mirror image of the orientation of the sensor S3' with respect to dashed line $P_1$. That is, the normal to sensor S1 is 45° with respect to line $P_1$, while the normal to sensor S3 faces in the opposite 45° direction from dashed line $P_1$. Similarly, the outputs of sensors S3' and S2' are equal when the sun is aimed at the array in the plane of dashed line $P_2$.

If the sun's rays are parallel to the plane in which dashed line $P_3$ is located and is aimed at the array, then sensors S1' and S2' will have equal outputs and indicate that the sun is facing the array which is the correct desired orientation. In this orientation, the output of sensor S3 is small and indicates shadow. Lines $P_1$ and $P_2$ intersect at 90° and lines $P_2$ and $P_3$ at 135° and $P_1$ and $P_3$ at 135°.

Figure 10:
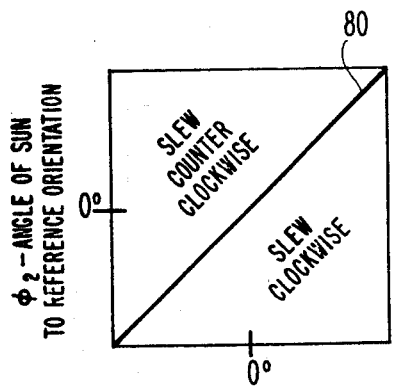

These relationships can be shown more graphically by mapping the outputs of the various sensors. In FIGS. 10-13, if it is assumed that the CP array is located at a latitude no greater than 60°, then the useful daylight illumination would occur when the sun is approximately ±112° from its reference, that is, its local noon position. In FIGS. 10-13 the angle $\theta$ is the angle of the CP array with respect to its reference orientation (horizontal) represented by 0°. $\theta_2$ is the angle of the sun with respect to its reference orientation (at local noon) represented by 0°. The graphs of FIGS. 10-13 are plots of the angle $\theta_1$ with respect to the angle $\theta_2$. $\theta_1$ and $\theta_2$ may each be ±112° about the 0° position. In FIG. 10, the line 80 represents the values of $\theta_1$ and $\theta_2$ in which the array is facing the sun in the correct orientation.

One object of the present system is to avoid the requirement to rotate the array beyond certain fixed limits defining a certain angle less than 360°. This is not a problem with respect to the seasonal axis as the total movement possible is only $\pm 23\frac{1}{2}° = 47°$. With respect to the diurnal axis, however, if the CP array initially is at or close to one extreme of its range, and the sun at or close to the other extreme, the angle between the normal to the array and the sun may be greater than 180°. In this case, the shortest travel distance for the CP array to reach its desired tracking position is through the "opposite" less than 180° sector of a 360° circle and this could involve, after tracking operation resumes, a total travel of the CP array through more than 360°. This would require the use of slip rings whereas it is desired to be able to hard wire the electrical connections to the system.

Keeping the above in mind, the various graphs describe the desired slewing direction to always insure that the CP array never does rotate beyond the fixed limits of the predetermined permitted slewing angle. In FIG. 10, the segment of the graph designated "slew clockwise" indicates when the array is in the relative orientation indicated by the values of $\theta_1$ and $\theta_2$, the array should be slewed clockwise to its tracking position. The slew counterclockwise segment indicates initial orientation of array relative to the sun which requires the array to be slewed counterclockwise to its tracking position. Thus, the line 80 represents the locus of values of $\theta_1$ and $\theta_2$ at which the normal to the array points directly toward the sun in a tracking mode. The control 66, to be described, shown in FIG. 8, applies an output signal to rotate the diurnal axis drive 32 either clockwise (positive) or counterclockwise (negative), in accordance with the sensed position of the array with respect to the angles $\theta_1$ and $\theta_2$ defined by line 80.

Figure 11:
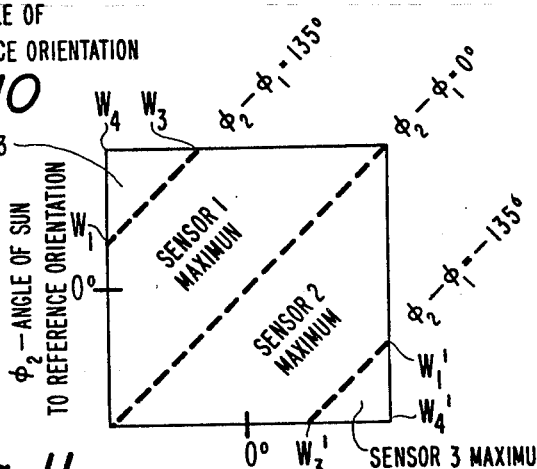

FIG. 11 is a graph of the maximum outputs of sensors S1, S2 and S3 at the various angles $\theta_1$ and $\theta_2$. The dashed line $\theta_2 - \theta_1 = 0$ in FIG. 11 corresponds to the dashed line $P_3$ in FIG. 9. This means that when the angle of the sun to its reference orientation is the same as the angle of the normal to the array to its reference orientation, the array is aimed toward the sun. The dashed line $\theta_2 - \theta_1 = 135°$ represents the dashed line $P_2$ of FIG. 9, at which the outputs of sensors S2 and S3 are equal. The area between 0° and −135° in the map of FIG. 11 represents the sector between dashed lines $P_2$ and $P_3$ of FIG. 9. When the sun is in this sector the output of sensor S2 is a maximum. The sector between 0° and +135° represents the sector between dashed lines $P_1$ and $P_3$ of FIG. 9. When the sun is in this sector, sensor S1 has an output which is greater than the output of the remaining sensors.

When sensor S3 has an output which is greater than the output of the remaining sensors S1 and S2 then its output is employed to control the drive means 32; however, whether clockwise or counterclockwise, the drive direction cannot be determined from FIG. 11. Sensor S3 can have a maximum output when the angle of the sun to its local noon reference orientation has a maximum positive value between points W1 and W4 and the angle of the array to its reference orientation has a negative value between points W3 and W4. It is also seen that the signal from sensor S3 is a maximum when the angle of the array to its reference orientation has a value between points W3' and W4' and the angle of the sun has a value between W1' and W4'. Thus there is ambiguity in determining in which direction the CP array should be driven.

Figure 12:
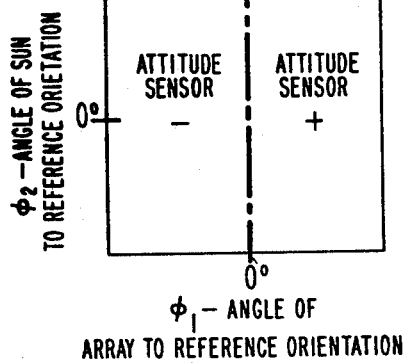

The attitude or gravity sensor S4 is provided to resolve the ambiguity above. FIG. 12 shows the condition of the gravity sensor S4, which indicates the attitude of the array with respect to the array's reference orientation. That is, sensor S4 indicates when the array is not horizontal and also the particular direction in which the array is tilted. For example, with the array tilted say clockwise in a direction about the axis $a_d$ out of the drawing as shown in FIG. 4, so that the switch is open, the CP array can be stated to be in its negative position. On the other hand, when the array is tilted counterclockwise about axis $a_d$ relative to its reference horizontal orientation, the switch closes and the CP array can be stated to be in its positive position. When the axis $a_s$ is horizontal or almost so, the switch S4 may be open or closed; however this does not adversely affect operation because in this region the fine tracking signals produced by sensor S5 assume control of the system (as will be described).

Figure 13:
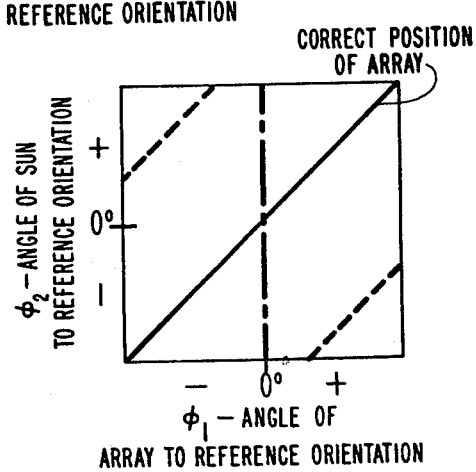

The graph of FIG. 13 is a superimposition of the maps of FIGS. 10, 11 and 12. When the output of sensor S3 is a maximum and the attitude sensor indicates a positive condition, the array must be slewed clockwise. Note that in FIG. 12, "attitude sensor +" is in the same region as "sensor 3 maximum" in FIG. 11 which is in the same region as "slew clockwise" in FIG. 10. It can also be seen from FIGS. 10-13 that when sensor S3 has an output that is a maximum and the attitude sensor indicates a negative condition, the array must be slewed counterclockwise to place it in the correct position. It is seen also that when the sensor S1 output is a maximum, the array is slewed counterclockwise. Similarly, the array is slewed clockwise when the sensor S2 output is a maximum.

The relationship between the desired slewing direction and the outputs of the various sensors may readily be obtained from an examination of FIG. 13. From FIG. 13 the following table may be derived.

TABLE 1

Specification of Correct Slewing Directions

| Sensor Having Maximum Output | Attitude Sensor Output | Slew Direction About Axis $a_d$ |
|---|---|---|
| 1 | + | counterclockwise |
| 1 | − | counterclockwise |
| 2 | + | clockwise |
| 2 | − | clockwise |
| 3 | + | clockwise |
| 3 | − | counterclockwise |

The embodiment illustrated has the advantage of being tolerant to errors in the outputs of the various sensors that might arise from partial obscuration of the sensors or electrical imbalance. Specifically, errors in the outputs of the various sensors that correspond to errors of up to ±15° in $\theta_1$ or $\theta_2$ will not change the slewing direction as indicated in Table 1, assuming $\theta_1$ and $\theta_2$ are ±112°. The exception to this occurs as the relative outputs of sensors S1 and S2 approach the same value when the array is nearly aimed at the sun. The errors which occur here are not important, because there are additional corrections made in response to control signals provided by the imaging sensor S5 of FIG. 1.

Other embodiments than that described above are possible. For example, the integrating surfaces of the various sensors can be 120° sectors of spheres instead of hemispheres. The boundaries of the regions in space where various sensors have greatest output in this case would be $\theta_2 - \theta_1 = -120°$, 0 and 120° instead of −135°, 0 and 135° as illustrated in FIG. 9. The correct slewing direction is still shown by Table 1. This embodiment is capable of operation in more extreme latitudes (an angular range of coordinates of FIG. 10 between ±120° instead of ±112°) but is less tolerant of errors. For in this case the $\theta_2 - \theta_1$ lines will intersect the ±120° angle of sun lines close to the 0° position.

Still other embodiments combine the angular range of a 120° sector and the tolerance to error of the hemisphere arrangement, but these are more complex than that described above. For example, a second array attitude sensor can be incorporated that indicates whether the orientation of the array about the diurnal axis is greater or less than about 75° westward of local noon. If the orientation is greater than 75° westward, the output of sensor S3 is multiplied by a factor of approximately 2. Once again, the correct slewing direction is as shown in Table 1. The embodiment is capable of operation with the angular range of coordinates in FIG. 10 in excess of ±120°, and with considerable tolerance of error.

Vanes provided the sensors S1 and S2 are not necessary to enhance their sensitivity. Increased sensitivity does not seem to be particularly necessary for operation of the system, because with state of the art components, good signal-to-noise ratios can be obtained. What is essential is that the use of vanes can provide considerable immunity from the effects of partial obscuration of the integrating sensors. For example, consider sensors S1 and S2, as shown in FIGS. 1 and 3, to be 3 inch diameter hemispherical integrating sensors and the vanes extend 8 inches in front of the hemispheres. When the array is aimed directly at the sun, the outputs of the sensors S1 and S2 are balanced, i.e., equal to each other. It can be shown that if one of the sensors is 50% obstructed, e.g., by a leaf, the signals from the sensors S1 and S2 will balance when the array is aimed only about 6° from the sun. The sun in this case will still be within the field of view of the imaging sensor S5 to be described, so the system will continue to operate unhampered by the partial obscuration of the integrating sensors. Thus, the vane 56 provided sensors S1 and S2 is not for the purpose of increasing sensitivity but for the purpose of reducing the effects of partial obscuration of one or more of the sensors from incident solar radiation.

Because the sensor S3 is located on the bottom of the array and is not subjected to the partial obscuration problem as much as sensors S1 and S2, a vane for this sensor ordinarily would not be required. To provide a balance, however, to the outputs of sensors S1 and S2, a vane 60 is provided the sensor S3. As the vane 56 of the sensors S1 and S2 shadows a portion of some of those sensors in the absence of partial obscuration, the output of sensor S3 normally would be greater than that of S1 for a given angle of the sun, due to the shadowing effect of the vanes 56. Vane 60 balances this effect.

The sensor S5 alluded to above provides a fine tracking signal. The sensor arrangement including S1–S4 provides coarse tracking signals to an accuracy of, for example, a 6° arc. Since, as mentioned in the introductory portion, the sun subtends an angle of about ½°, this 6° tracking accuracy is insufficient to maintain optimum tracking of the sun. For this reason, the imaging sensor S5 is provided.

The angular field of view of the imaging sensor S5 should be at least 6° to be compatible with the coarse sensor. It is not desirable for the angular field of view to be too large, e.g., greater than 14°. This larger field of view may result in appreciable mis-aiming of the array when bright clouds appear adjacent the sun when viewed from the array. In one implementation, a field of view of 9° was found to satisfy the above restrictions.

In FIG. 6, the sensor S5 includes a rectangular housing 82 which is mounted to the side of array 14. Lens 84 is a convex uncorrected lens which is corrected only about the center axis 86. This lens can be made relatively cheaply as no additional correction segments need be added to it. It is relatively easy to manufacture an inexpensive lens with a corrected central portion. As is known in the optics field, aberrations in spherical lens occur most frequently at the extremities of the lens.

Sensor S5 includes four tracking photo cells 88 (only two of which are visible) which are set up to track in the usual manner. One example of such a tracking arrangement is described in more detail in U.S. Pat. No. 4,041,307. The focal point for the lens 84, however, is below the cells 88 so that the cells are inside of the focal distance. To decrease the probability that the lens will be completely or almost fully obscured, e.g., by a fallen leaf, the diameter of the lens is fairly large, e.g., several inches in diameter. A large field of view with a photodetector of a given size implies that the focal length of the lens is made fairly small. This combination of large lens diameter and small focal length implies a wide aperture lens, i.e., one with a low f-number. In the preferred embodiment an aperture in the neighborhood of f/1 is preferred.

Immunity from the effects of partial obscuration of a lens is obtained when the detector is at the focus of a well corrected lens. For example, an in focus, unobscured, well corrected lens has a small solid circular area that represents the focused image. After placing the photodetector at the focal area of the well corrected lens no problem arises due to obscuration as the obscured image will remain at the focal point as a bright spot. Well corrected lenses, however, with apertures in the neighborhood of f/1 are complex and costly. Since a high degree of correction is required only when the solar illumination is parallel to the lens axis to insure the on axis image is properly focused, it is sufficient to use the lens corrected only for on-axis operation. That is, it is only when the sun is on-axis and aiming directly at the array in a tracking mode that the focused image of solar illumination should be parallel to the lens axis and the sun's image centered on the detector.

A simple, aspheric lens is sufficient to meet these constraints. A two inch focal length, f-1, infinity corrected aspheric Fresnel lens provides a very high degree of immunity from the effects of partial obscuration.

A simple inexpensive lens with spherical surfaces can be effectively used in the following manner. Such a lens, with high aperture, is not well corrected, even for on-axis operation. A distant light source with a small angular extent (such as the sun) image which is focused onto the detector's surface appears as shown in FIG. 14A. The FIGURE shows a fairly sharp, bright central image surrounded by a much larger illuminated region with an indistinct boundary, denoted by the dashed lines. The illumination outside the central image is due largely to the effects of spherical aberration. The image that results when part of the lens is obscured from one side by an opaque, straight edge object is shown in FIG. 14B. The shape of the central image is not appreciably effected but the surrounding illuminated region is eclipsed in an asymmetrical way that would unbalance the signals generated by the four quadrants of the detector and therefore produce an aiming error.

FIG. 14C shows the appearance of the image when the detector is situated inside the focus of the unobscured lens. The central image is broadened with respect to FIG. 14A. The surrounding illuminated region is slightly smaller. When the lens in this configuration is obscured as described above, the appearance of the images is as shown in FIG. 14D. The illuminated region surrounding the central image is eclipsed at 92 much like it was in FIG. 14B, but now the central image is also eclipsed at 90, in the direction opposite from the eclipsing of the surrounding illumination. Furthermore, the degree of eclipsing of the central image can be controlled by changing the distance that the detector plane is placed inside the focal distance. The deleterious effects of lens aberrations on immunity to partial obscuration can therefore be cancelled to a large measure by positioning the detector in a plane different from the focal plane of the lens.

For example, with a 1.81 inch diameter, 1.73 inch focal length, symmetrical double convex lens with a detector array 0.32 inches inside of focus, an aiming error of no more than 1/6th degree results, which is tolerable in the above system for worst case lens obscurations of up to 50%. For different lens configurations the optimum detected placement may be outside, rather than inside of focus.

The positioning of the sensors S1 and S2 adjacent the back surface of the arrays permits the use of the sides 42 and 46 of the arrays 12 and 14 of FIG. 1 to also effectively operate as vanes with respect to these sensors. This effective vane operation also helps to minimize obscuration effects on these two sensors.

The fine sensor S5 operates over an angular extent slightly greater than the angular accuracy of the coarse sensors S1-S4. For example, if the coarse sensors are accurate to 6° of arc, the sensor 5 operates over an angular extent of about 9° so that its field of view is a cone subtending a 9° angle. Sensor S5 sends a signal to control 66 when the sun is in its field of view. Control 66 then overrides the signals from sensors S1-S4 to operate the drives 22 and 32. This accounts for the "don't care" state of sensor S4 in this position as mentioned above. Also, the low tolerance for error of the sensors S1-S4 in this 9° range is also immaterial due to the overriding effect of sensor S5.

In FIG. 8, the sensors S1-S5 are connected to control 66. Control 66 can be implemented in many different ways to provide the functions desired. These functions include (1) responding to the drive signals derived from the coarse position sensors S1 and S2 to operate the drive means 32 and 22 during slewing when the output of S3 is less than that of either S1 or S2; (2) responding to the signals from gravity sensor S4 and light sensor S3 for controlling the coarse slewing of drive means 32 in response to a drive signal derived from S3 and in a direction indicated by S4 when the output of S3 exceeds that of either S1 or S2; and (3) responding to the drive signals derived from the fine position sensor S5 to operate the two drive means 22 and 32 during the tracking mode and for effectively disconnecting the other sensors S1-S4 from the system during such tracking mode. By way of example only, following is a generalized description of one implementation, it being understood that others, within the skill of the art, are possible.

Control 66 includes the amplifiers 62 and 64 of FIG. 7 and corresponding amplifiers for the sensor S5. The outputs of amplifiers 62 and 64 are DC levels useful for slewing the CP array to its approximate tracking position within the field of control of fine tracking sensor S5. When within tracking range, the output of sensor S5 exceeds a given threshold and, in one example, pulse width modulated pulses derived from S5 are employed to drive the drive means 22 and 32 and the outputs derived from sensors S1 and S2 are disconnected from the drive means. If in the initial slewing mode the output of S3 exceeds that of S1 or S2, sensors S3 and S4 cause the control 66 to determine which direction about the axis $a_d$ to slew the CP array in accordance with FIG. 13. In this case logic elements within 66 control the sense of the application of the direct current drive signal produced in response to the output of S3 to the drive means 32 for slewing the CP array in the desired direction and disconnects the outputs from sensors S1 and S2 from the drive means 32.

The circuit for S3 may include a normally primed gate receptive of the output of S3 for applying the output through suitable amplifiers for producing DC level drive signals only when the S3 output exceeds that of S1 or S2. Logic within 66 controls the direction of application of these DC levels to drive means 32 in accordance with the output of gravity sensor S4 for controlling the direction of rotation of the CP array during slewing. This logic also is employed to disconnect the output of amplifier 64 (FIG. 7) from 32 so that in this mode the S3 derived drive signals rather than the S1, S2 derived drive signals control the slewing of drive means 32.

When the CP array reaches within 6° of its final position, the final tracking sensor S5 outputs are applied to circuits within control 66 which produces the fine drive control signals. In one embodiment these were four pulse width modulated signals. These signals are sensed and employed to produce logic levels which effectively disable the normally enabled gate at the output of S3 for disconnecting S3 from the system and disable gates receptive of the drive signals derived from S1 and S2 for disconnecting them from the system. Concurrently, the four pulse width modulated signals are applied to the drive means 22 and 32 for taking over fine control thereof for operating these means during the tracking mode. One pulse width modulated signal is applied to the (+) drive input and a second signal to the corresponding (−) drive of one of the drive means 22 and the other pair of such signals is applied in similar fashion to drive means 32. The signal with the greater width pulses for a drive means determines the direction of rotation of that drive means.

As mentioned, the S5 output, when present and of greater than a given level, is employed to remove the S1, S2 and S3 inputs from the drive means, for example, by disabling gates through which the amplified signals of these sensors flow. In this way sensor S5 overrides the outputs of sensors S1, S2, S3 and S4. When the sensor S5 output is low, meaning the system is in the coarse tracking mode outside the field of view of sensor S5, the output (if any) of sensor S5 has essentially no effect of the system operation.

What is claimed is:

1. In a solar tracking system including means responsive to a first signal applied as an input thereto for moving the system about a polar oriented axis and means responsive to a second signal applied as an input thereto for moving the system about a second axis orthogonal to said polar oriented axis, means for producing said first and second signals, said means for producing said first and second signals including lens means for concentrating solar energy in a given area and a plurality of solar sensor means responsive to the concentrated energy in said given area for producing said first and second signals, said lens means comprising a lens which when partially obscured tends to produce asymmetrically eclipsed concentrated energy in said area to thereby produce an error in said first and second signals, said lens means having a given focal length, the improvement therewith comprising:

said plurality of solar sensor means being spaced at a plane other than at said given focal length, said plane being located between said lens and its focal point so as to receive an image from said lens which compensates for said eclipsed energy to effectively symmetrically concentrate the energy in said given area.

2. The lens means of claim 1 wherein said lens means comprises a double convex, spherical lens.

3. The lens means of claim 2 wherein said lens is corrected only at a central portion thereof.

* * * * *